United States Patent [19]
Kawabata et al.

[11] Patent Number: 5,274,916
[45] Date of Patent: Jan. 4, 1994

[54] METHOD OF MANUFACTURING CERAMIC MULTILAYER ELECTRONIC COMPONENT

[75] Inventors: Shoichi Kawabata; Norio Sakai; Kenji Minowa, all of Kyoto, Japan

[73] Assignee: Murata Manufacturing Co., Ltd., Japan

[21] Appl. No.: 992,161

[22] Filed: Dec. 17, 1992

[30] Foreign Application Priority Data

Dec. 18, 1991 [JP] Japan .................. 3-334879

[51] Int. Cl.$^5$ .................................. B44C 1/22
[52] U.S. Cl. .................................. 29/848; 29/852
[58] Field of Search ............ 29/830, 848, 857, 852, 29/423; 264/61; 174/262, 263; 427/97

[56] References Cited

U.S. PATENT DOCUMENTS

| | | | |
|---|---|---|---|
| 3,370,351 | 2/1968 | Freehauf et al. | 29/852 |
| 4,521,449 | 6/1985 | Arnold et al. | 264/61 |
| 4,715,117 | 12/1987 | Enomoto | 29/852 |
| 4,817,276 | 4/1989 | Toda et al. | 29/830 |
| 4,925,723 | 5/1990 | Bujatti et al. | 29/852 |
| 4,964,947 | 10/1990 | Yarita et al. | 29/852 |
| 4,964,948 | 10/1990 | Reed | 427/97 |
| 5,120,384 | 6/1992 | Yoshimitsu et al. | 29/852 |

FOREIGN PATENT DOCUMENTS

| | | |
|---|---|---|
| 0040905 | 2/1981 | European Pat. Off. . |
| 0331161 | 6/1989 | European Pat. Off. . |
| 8802928 | 4/1988 | World Int. Prop. O. . |

*Primary Examiner*—Irene Cuda
*Attorney, Agent, or Firm*—Ostrolenk, Faber, Gerb & Soffen

[57] ABSTRACT

A ceramic green sheet is formed on a carrier film; both the ceramic green sheet and the carrier film are cut into prescribed dimensions; a hole to serve as a via hole is provided in the ceramic green sheet while the ceramic green sheet is maintained in the state backed with the carrier film; the hole is filled up with a conductive paste while the ceramic green sheet is in this state; an interconnection pattern is formed on the ceramic green sheet which is still backed up with the carrier film; and the ceramic green sheet is then separated from the carrier film and is then immediately stacked in order on other ceramic green sheets. Thus, it is possible to improve the accuracy in stacking of ceramic green sheets in a method of manufacturing a ceramic multilayer circuit board having portions electrically connected through via holes.

8 Claims, 4 Drawing Sheets

FIG. 2
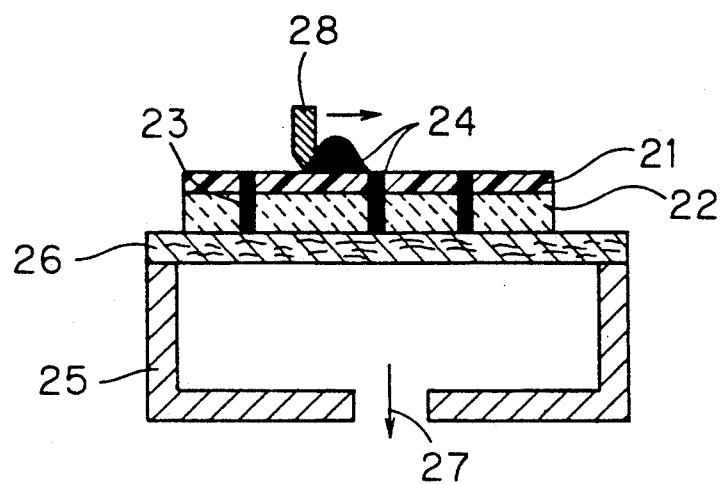
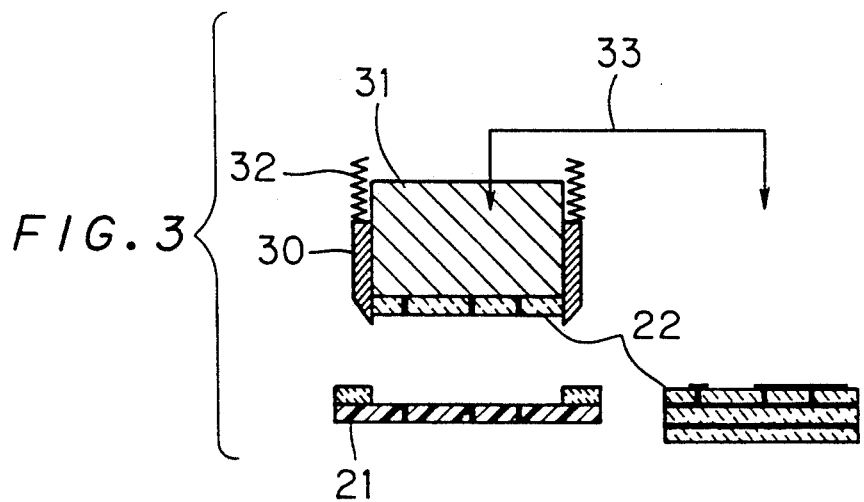
FIG. 3

METHOD OF MANUFACTURING CERAMIC MULTILAYER ELECTRONIC COMPONENT

BACKGROUND OF THE INVENTION

Field of the Invention

The present invention relates to a method of manufacturing a ceramic multilayer electronic component such as a ceramic multilayer circuit board, a hybrid IC having a ceramic multilayer structure or an LC composite part having a ceramic multilayer structure.

Description of the Background Art

FIG. 4 shows some steps which are included in a conventional method of manufacturing a ceramic multilayer circuit board as an exemplary ceramic multilayer electronic component.

First, a ceramic green sheet 2 is formed on a carrier film 1 and then dried, as shown at (1). In order to form such a ceramic green sheet 2, ceramic slurry is applied to one surface of the carrier film 1 by a doctor blade or the like.

Then, the carrier film 1 is separated from the ceramic green sheet 2, as shown at (2).

Then, the ceramic green sheet 2 is punched into prescribed dimensions, as shown at (3).

Then, holes 3, which serve as via holes, are provided in the ceramic green sheet 2 with a punch, a drill or the like, as shown at (4).

Then, the holes 3 are filled up with conductive paste 4, as shown at (5). FIG. 5 shows a concrete example of the step of applying such conductive paste 4. The conductive paste 4 is applied by screen printing through a screen 5. The ceramic green sheet 2 provided with the holes 3 is placed on a suction stage 7 through an air-permeable sheet 6. The suction stage 7 is supplied with vacuum suction as shown by arrow 8, thereby applying suction pressure into the holes 3 through the air-permeable sheet 6. The screen 5 is provided with patterns 9, in positions corresponding to the holes 3 provided in the ceramic green sheet 2. These patterns 9 are slightly larger in diameter than the holes 3. The conductive paste 4 is spread on the screen 5 by a squeegee 10, so as to be filled up in the holes 3. Then the conductive paste 4 is dried.

An interconnection pattern 11 is formed by screen printing, for example, as shown at (6) in FIG. 4. Thereafter the interconnection pattern 11 is dried.

The steps shown at (5) and (6) in FIG. 4 may be simultaneously carried out. Then the ceramic green sheet 2 shown at (6) is stacked on other ceramic green sheets in a prescribed order. At this time, it is necessary to align the ceramic green sheet 2 with the other ceramic green sheets on the basis of its end surfaces, or through alignment holes provided in the ceramic green sheet 2 and pins inserted in such holes.

However, the aforementioned conventional method of manufacturing a ceramic multilayer circuit board has the following problems:

(A) The ceramic green sheet 2, having a small thickness of about 50 to 200 μm in general, is undulated, swollen, warped or misshapen by contraction when the ceramic green sheet is dried with the interconnection pattern 11 printed thereon. Thus, the ceramic green sheet 2 is displaced from the other ceramic green sheets in the stacking step so as to cause defects of characteristics such as capacitance and inductance.

(B) The aforementioned problem may further lead to a critical defect such as imperfect conduction of the via holes defined by the holes 3.

(C) While extension parts 12 shown at (5) in FIG. 4 are increased in size in order to prevent the problem (B), high-density interconnection cannot be attained and it is difficult to miniaturize the circuit board in this case.

(D) When the ceramic green sheet 2 is reduced in thickness, rigidity thereof is reduced so that it is difficult to handle the ceramic green sheets. This also causes the aforementioned problem (A). Thus, the ceramic green sheet 2 is restricted in applicable thickness.

SUMMARY OF THE INVENTION

Accordingly, an object of the present invention is to provide a method of manufacturing a ceramic multilayer electronic component which avoids the aforementioned problems (A) to (D).

A method of manufacturing a ceramic multilayer electronic component according to the present invention comprises the steps of forming a ceramic green sheet on a carrier film, providing a hole to serve as a via hole in the ceramic green sheet which is maintained in the state backed with the carrier film, filling up the hole with conductive paste in this state, forming an interconnection pattern on the ceramic green sheet backed with the carrier film, separating the ceramic green sheet from the carrier sheet, and stacking the ceramic green sheet in order on other ceramic green sheets immediately after the separation from the carrier film.

According to the present invention, at least the steps of providing a hole to serve as a via hole, filling up the hole with conductive paste and forming an interconnection pattern are carried out on the ceramic green sheet while it is maintained in the state backed with the carrier film, so that the ceramic green sheet is separated from the carrier film immediately before the ceramic green sheet is stacked on other ceramic green sheets. Thus, it is possible to prevent the occurrence in the ceramic green sheet from of problems such as undulation, swelling, warping or misshaping by contraction. While a ceramic green sheet which is backed with no carrier film is contracted by 0.3 to 0.5%, for example, such contraction can be limited suppressed to about 0.05% when the ceramic green sheet is backed with the carrier film.

According to the present invention, therefore, accuracy is improved in stacking of the ceramic green sheets. Thus, electric characteristics such as capacitance and inductance are improved in the ceramic multilayer electronic component. Further, reliability in conduction through via holes is improved. Consequently, it is possible to reduce the via holes and extension parts thereof in diameter, thereby enabling high density interconnection and miniaturization.

It has been confirmed by experiment that it is possible to handle a ceramic green sheet of about 10 μm in thickness. Thus, the design of the thickness of the ceramic green sheet is substantially unlimited.

Further, since most of the series of steps of handling the ceramic green sheet are carried out while the ceramic green sheet is maintained in the state backed with the carrier film, the ceramic green sheet can be easily handled to facilitate automation of the steps.

In addition, the accuracy in stacking of the ceramic green sheets is improved as described above so that it is possible to increase the dimensions of handleable ceramic green sheets while also maintaining the desired accuracy, whereby productivity of the ceramic multilayer electronic component is improved.

Since the steps of providing a hole to serve as a via hole and filling up the hole with conductive paste are carried out while the ceramic green sheet is maintained in the state backed with the carrier film, the conductive paste which is filled up in a hole also provided in the carrier film may be partially transferred to the ceramic green sheet. In this case, the transferred part of the conductive paste piles up on an end surface of the hole which serves as a via hole, leading to further improvement in reliability of conduction through the via hole.

Furthermore the step of forming an interconnection pattern, it is possible to prevent the ceramic green sheet from contamination, which is caused by rubbing in the equipment, since one surface of the ceramic green sheet is masked with the carrier film. Thus, it is possible to keep the ceramic green sheet clean, thereby contributing to improvement in quality of the ceramic multilayer electronic component obtained.

In the step of filling up the hole of the ceramic green sheet with conductive paste, it is possible to directly supply the conductive paste onto the carrier film in place of a screen, for applying the conductive paste into the hole with a squeegee. In this case, no screen is required for filling up the hole with conductive paste and hence no step is required for aligning such a screen with the hole. Thus, both step and the equipment are simplified.

After the step of forming the ceramic green sheet on the carrier film, these elements may be cut together to desired dimensions so that the ceramic green sheet is then subjected to the following steps. In this case, it is easier to employ a method, which is further suitable for multi-item small-quantity production, of carrying the ceramic green sheet through the steps as compared with a case of directly handling a long ceramic green sheet.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a sectional view showing a concrete example of an apparatus for carrying out the step shown at (4) in FIG. 1;

FIG. 3 is a sectional view showing a step of stacking a ceramic green sheet 22 which is carried out after the step shown at (5) in FIG. 1;

DESCRIPTION OF THE PREFERRED EMBODIMENTS

An embodiment of the present invention is now described with reference to a method of manufacturing a ceramic multilayer circuit board.

Figure 1:
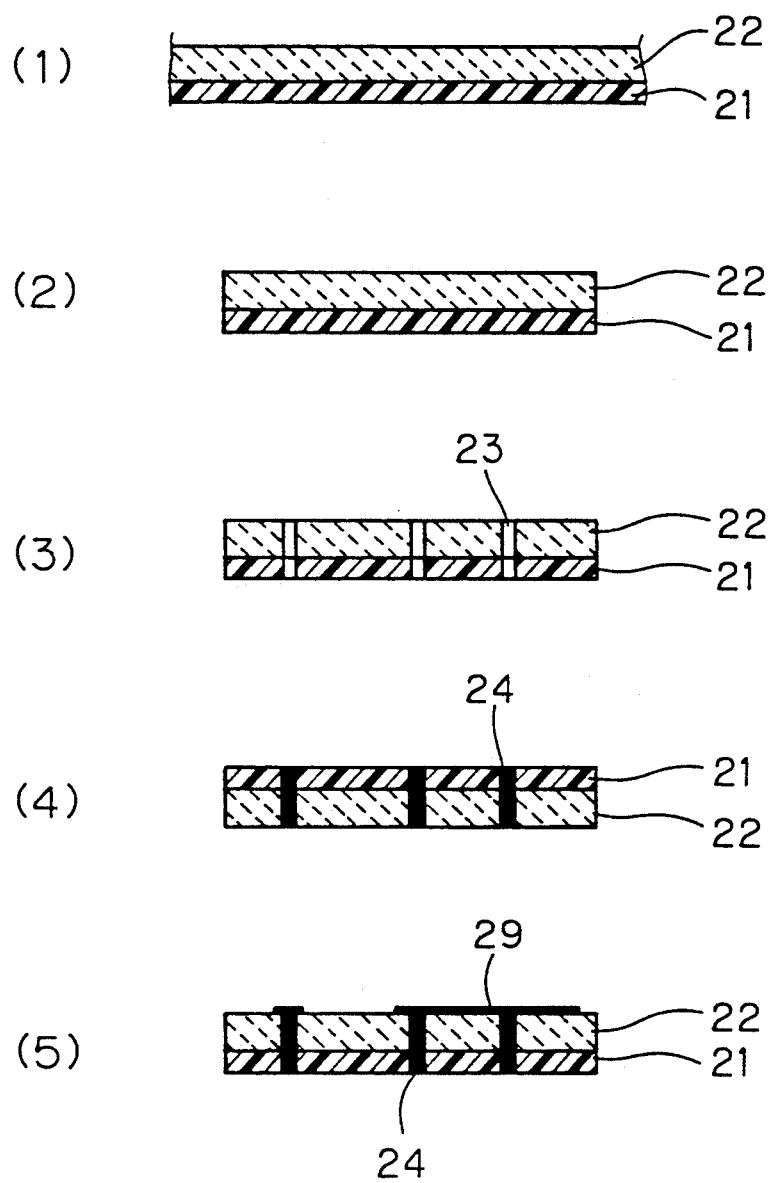
FIGS. 1(1)-1(5) shows successive sectional views illustrating some steps which are included in a method of manufacturing a ceramic multilayer circuit board according to an embodiment of the present invention.
Figure 4:
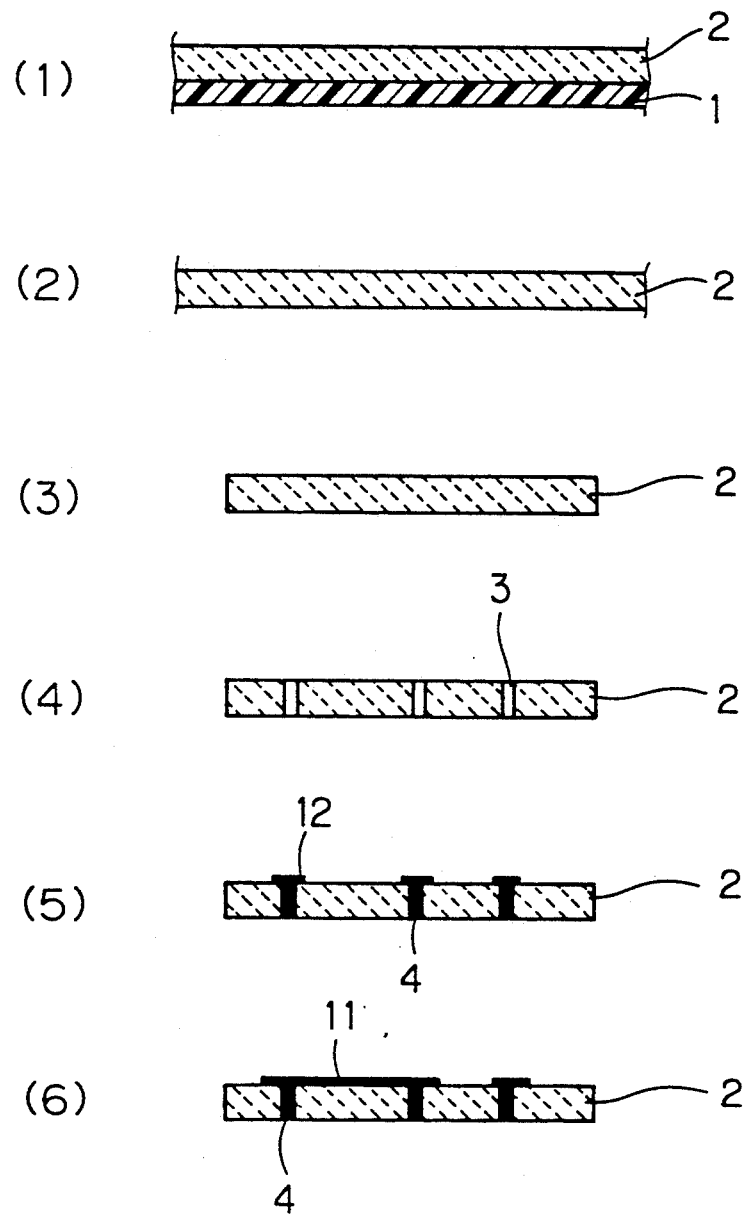
FIGS. 4(1)-4(6) shows successive sectional views illustrating some steps which are included in a conventional method of manufacturing a ceramic multilayer circuit board.

FIG. 1 shows some steps which are included in the method according to the embodiment.

First, a ceramic green sheet 22 is formed on a carrier film 21 of polyethylene terephthalate, for example, and then dried, as shown at (1). The ceramic green sheet 22 is formed by applying ceramic slurry to one surface of the carrier film 21 by a doctor blade or the like, for example.

Then, the ceramic green sheet 22 is cut to prescribed dimensions together with the carrier film 21, as shown at (2). This step is carried out through punching with a die, or cutting with a blade, for example.

Then, holes 23 to serve as via holes are provided with a punch, a drill or the like, in the ceramic green sheet 22, which is maintained in the state backed with the carrier film 21, as shown at (3). The holes 23 pass through not only the ceramic green sheet 22 but also the carrier film 21. At this time, reference holes may be formed in the ceramic green sheet 22 for use in the printing and stacking steps described below.

Then, the holes 23 are filled up with conductive paste 24, which is then dried, as shown at (4). FIG. 2 shows a concrete example of the step of applying the conductive paste 24.

As shown in FIG. 2, the ceramic green sheet 22, which is backed with the carrier film 21, is placed on a suction stage 25 through an air-permeable sheet 26. At this time, the carrier film 21 is preferably located on top so that the ceramic green sheet 22 is in contact with the air-permeable sheet 26. In this state, the suction stage 25 is supplied with vacuum suction as shown by the arrow 27, thereby applying suction pressure into the holes 23 through the air-permeable sheet 26. The conductive paste 24 is supplied onto the carrier film 21, and a squeegee 28 is driven over the surface of the carrier film 21 so as to fill up the holes 23 with the conductive paste 24.

The aforementioned air-permeable sheet 26, which is prepared from a filter material such as paper, for example, is also adapted to prevent the suction stage 25 from contamination by the conductive paste 24. This sheet 26 is replaced by a new one when the sheet 26 is contaminated. If the air-permeable sheet 26 is mechanically soft, the suction stage 25 may be provided with a member for supporting the lower surface of the air-permeable sheet 26.

Figure 5:
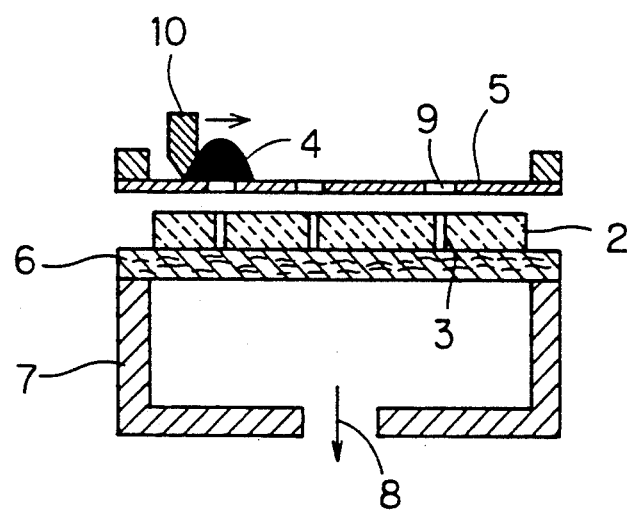
FIG. 5 is a sectional view showing a concrete example of an apparatus for carrying out the step shown at (5) in FIG. 4.

The step of filling up the holes 23 with the conductive paste 24 may alternatively be carried out by screen printing as shown in FIG. 5, and in this case, the ceramic green sheet 22 may be located on top in the step shown in FIG. 2.

Then, an interconnection pattern 29 is formed on the ceramic green sheet 22 by screen printing, for example, and then dried, as shown at (5) in FIG. 1.

Then, the ceramic green sheet 22 obtained is separated from the carrier film 21, and stacked on other ceramic green sheets along a prescribed order. FIG. 3 shows concrete examples of these steps.

As shown in FIG. 3, a suction head 31 is used, which is provided with cutting blades 30 around the suction head 31. The cutting blades 30, which are vertically movable in a prescribed range with respect to the suction head 31, are downwardly urged by springs 32.

These cutting blades 30 are downwardly moved with the suction head 31 toward the ceramic green sheet 22, thereby cutting the ceramic green sheet 22 into prescribed dimensions. At this time, the cutting blades 30 may slightly cut into the carrier film 21. The cut ceramic green sheet 22 is slightly smaller in dimension than the ceramic green sheet 22 cut with the carrier film 21 at the step (2) shown in FIG. 1.

Immediately after such cutting, the suction head 31 sucks the ceramic green sheet 22 to separate the ceramic green sheet 22 from the carrier film 21 following upward movement thereof. Immediately after such separation, the suction head 31 is moved along arrow 33 to stack the ceramic green sheet 22 in order on other ceramic green sheets at a prescribed position. At this time, the ceramic green sheet 22 may be partially coated with an adhesive, or pressed against the other ceramic green sheets with a hot plate so as to be provisionally compression-bonded thereto, so that the ceramic green sheet 22 is not displaced from the other ceramic green sheets in later steps.

In the aforementioned stacking step, the ceramic green sheet 22 can be aligned with the other ceramic green sheets the basis of end surfaces thereof, through alignment holes provided in the ceramic green sheet 22 and reference pins inserted therein, with a frame which serves as the basis of alignment, or by image processing of alignment marks (or holes), for example.

Although the present invention has been described with reference to a method of manufacturing a ceramic multilayer circuit board, the inventive method is widely applicable to ceramic multilayer electronic components such as a hybrid IC and an LC composite part, so far as the components have ceramic multilayer structures and via holes.

While the ceramic green sheet 22 is cut into prescribed dimensions with the carrier film 21 in the step shown at (2) in FIG. 1 in the aforementioned embodiment, the carrier film 21 may be replaced by a carrier film previously having prescribed dimensions, so that the ceramic green sheet 22 is formed thereon.

Further, the ceramic green sheet 22 which is in the state shown at (5) in FIG. 1 may be directly separated from the carrier film 21 through no cutting step shown in FIG. 3, so as to be stacked on other ceramic green sheets.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a ceramic multilayer electronic component, comprising the steps of: forming a ceramic green sheet on a carrier film; and then
   (A) while said ceramic green sheet is backed by said carrier film:
      (a) providing a hole for serving as a via hole in said ceramic green sheet;
      (b) filling up said hole in said ceramic green sheet with a conductive paste; and
      (c) forming an interconnection pattern on said ceramic green sheet; and
   (B) employing a suction head with cutting blades to cut and hold said ceramic green sheet while backed by said carrier film, followed by the steps of:
      (a) separating said suction head and with it said ceramic green sheet from said carrier film; and
      (b) employing said suction head to stack said ceramic green sheet in order on other ceramic green sheets substantially immediately after said separation.

2. A method of manufacturing a ceramic multilayer electronic component in accordance with claim 1, wherein said step of providing a hole for serving as a via hole includes the step of providing said hole to pass through both of said ceramic green sheet and said carrier film.

3. A method of manufacturing a ceramic multilayer electronic component in accordance with claim 2, wherein said step of filling up said hole with conductive paste includes the step of supplying said conductive paste onto a surface of said carrier film and driving a squeegee over said surface of said carrier film thereby filling up said hole with said conductive paste.

4. A method of manufacturing a ceramic multilayer electronic component in accordance with claim 3, wherein said step of filling up said hole with conductive paste is carried out by placing an air-permeable sheet so as to be in contact with a surface of said ceramic green sheet, opposite to a surface of said ceramic green sheet having said carrier film, and applying vacuum suction into said hole through said air-permeable sheet.

5. A method of manufacturing a ceramic multilayer electronic component in accordance with claim 4, wherein said air-permeable sheet is made of paper.

6. A method of manufacturing a ceramic multilayer electronic component in accordance with claim 4, further comprising a step of replacing said air-permeable sheet by a new one.

7. A method of manufacturing a ceramic multilayer electronic component in accordance with claim 1, wherein said ceramic green sheet has a thickness in the range from about 10 $\mu$m to about 200 $\mu$m.

8. A method of manufacturing a ceramic multilayer electronic component in accordance with claim 1, wherein said ceramic green sheet has a thickness of about 10 $\mu$m.

* * * * *